(12) United States Patent
Johnson et al.

(10) Patent No.: US 7,381,276 B2
(45) Date of Patent: Jun. 3, 2008

(54) SUSCEPTOR POCKET WITH BEVELED PROJECTION SIDEWALL

(75) Inventors: Donna K. Johnson, Underhill, VT (US); Jim S. Nakos, Essex Junction, VT (US); Jean-Jacques H. Psaute, Colchester, VT (US); Bernard A. Roque, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 523 days.

(21) Appl. No.: 10/064,451

(22) Filed: Jul. 16, 2002

(65) Prior Publication Data

US 2004/0011293 A1 Jan. 22, 2004

(51) Int. Cl.
*H01L 21/00* (2006.01)
*C23C 16/00* (2006.01)

(52) U.S. Cl. .................. 118/725; 118/728; 118/724; 118/500; 156/345.51; 156/345.52; 156/345.53; 156/345.54

(58) Field of Classification Search ............... 118/725, 118/728, 500; 156/345.51
See application file for complete search history.

(56) References Cited

U.S. PATENT DOCUMENTS 5,605,866 A   2/1997  McClanahan et al. ...... 437/225
5,785,764 A * 7/1998  Hoshina et al. ............ 118/500
5,820,329 A   10/1998 Derbinski et al. ........... 414/225
5,968,379 A * 10/1999 Zhao et al. ............ 219/121.52
6,007,635 A * 12/1999 Mahawili ................... 118/728
6,143,147 A   11/2000 Jelinek .................. 204/298.15
6,202,592 B1  3/2001  Nozawa et al. ......... 118/723 R
6,258,228 B1  7/2001  Reiss .................... 204/298.15
6,267,655 B1  7/2001  Weldon et al. ............. 451/307
6,596,086 B1 * 7/2003  Honma et al. .............. 118/728

FOREIGN PATENT DOCUMENTS

JP         07074114 A  *  3/1995

* cited by examiner

Primary Examiner—Ram N. Kackar
(74) Attorney, Agent, or Firm—Gibb & Rahman, LLC; Anthony Canale

(57) ABSTRACT

An apparatus for holding a semiconductor substrate comprises a plate having a pocket which holds the substrate, wherein the pocket comprises a lower surface and an inner edge. The inner edge comprises a plurality of members extending radially inward to reduce the area of contact between the inner edge and the substrate. The beveled edge is inclined so that there is an acute angle between the lower surface of the pocket and the beveled edge.

16 Claims, 2 Drawing Sheets

SUSCEPTOR POCKET WITH BEVELED PROJECTION SIDEWALL

BACKGROUND OF THE INVENTION

1. Field of the Invention

The present invention generally relates to semiconductor wafer processing and, in particular, to an apparatus for supporting semiconductor wafers during processing and for providing film uniformity improvements on wafers.

2. Description of the Related Art

Conventional wafer support mechanisms, such as susceptors, do not guarantee good film uniformity for single wafer tools. Often, these conventional susceptors yield films with poor and uneven uniformities, and with WOOPS (Wafer Out Of Pocket) errors, which results in subsequent reworking procedures. Moreover, conventional tools attempt to level the susceptor to prevent any sliding of the wafer. In fact, conventional tools use a leveling kit to set up the susceptor. However, the level of the susceptor shifts with time, thereby creating uniformity problems.

In the semiconductor wafer and substrate processing fields, various types of processing equipment are utilized which provide for automated handling of wafers in a vacuum environment. One of the more important concerns in the handling and processing of such wafer substrates is the need to minimize particle generation that could contaminate the wafers, subsequently damaging the devices being formed thereon. In an effort to ameliorate this, most semiconductor device fabrication is conducted within a "clean room" environment where extreme measures are taken to minimize the presence of particulate matter.

At a process station, it may be necessary to hold the wafer firmly against a support surface with a clamp during processing, for example, to maintain the position of the wafer relative to the processing equipment or to maintain good thermal contact to a heat transfer element. One conventional technique for maintaining the temperature of a wafer undergoing processing in a vacuum environment is to introduce a conductive gas in a narrow space at the backside of the wafer, thereby thermally coupling the wafer to a temperature control element. When using a backside gas, which is introduced at a pressure higher than the ambient pressure of the processing chamber, clamping means are required to ensure that the backside gas does not move the wafer off of the support surface.

In most cluster tool systems, and many other types of semiconductor processing systems, the wafers are loaded onto and removed from the process platform in a horizontal orientation. This allows gravity to be used to hold the wafer in place on the surface of the platform while the wafer is clamped and un-clamped. Therefore, unclamping normally involves simply translating the clamp mechanism in an upward direction, and relying on gravity to cause separation of the wafer and the clamp.

Unfortunately, the conventional methods used in a process chamber may cause the clamp to adhere to a wafer after completion of processing of the wafer at the process station, thus preventing the wafer from being picked up by the transport mechanism such as an automated clasp. For example, this may occur when a metal layer is deposited over a wafer which causes the wafer to stick to the clamp. Another example is when the top layer of a wafer melts at an elevated temperature, causing the top layer to adhere to the clamp.

When a semiconductor wafer sticks to a clamp, the processing system typically must be shut down to free the stuck wafer, a procedure that normally involves manual intervention at atmospheric pressure. After the process chamber is vented to atmosphere to permit manual wafer removal, it can take several hours before the chamber can be placed back in service due to the need to pump down the chamber and allow out-gassing of contaminants (e.g., water vapor, etc.) that have become adsorbed to the chamber surfaces. Thus, it can easily take several hours to recover from a stuck wafer.

Conventional systems have not adequately solved this problem. Moreover, the conventional systems have not adequately provided a device which improves the film uniformity of the semiconductor wafer undergoing processing. As such, wafers are constantly being processed with defects, thereby resulting in time consuming and costly rework procedures. Therefore, there is a need for a new and improved semiconductor wafer processing apparatus, which greatly improves the film uniformity of the wafer during processing, and which can be installed easily.

BRIEF SUMMARY OF THE INVENTION

In view of the foregoing and other problems, disadvantages, and drawbacks of the conventional semiconductor wafer processing mechanisms, the present invention has been devised, and it is an object of the present invention to provide an apparatus for holding a substrate during semiconductor processing, thereby resulting in improved film uniformity on the semiconductor wafer undergoing processing. It is another object of the present invention to provide an easy set-up of the susceptor level. Yet another object of the present invention is to provide for installation of a new apparatus with repeatable good uniformities without errors, and without requiring rework of the susceptor. Still, another object of the present invention is to provide good process results even with susceptor leveling shifts. Another object of the present invention is to provide a susceptor with small points of contact with the wafer. It is yet another object of the present invention to improve the angle of the contacts to the wafer.

In order to attain the objects suggested above, there is provided, according to one aspect of the invention, a process of releasably securing a semiconductor substrate in a processing apparatus. The apparatus comprises a plate having a pocket holding the substrate. A plurality of members extending radially inward from the inner edge of the pocket and have an inclined beveled edge that produces an acute angle between the lower surface and the beveled edge. The members reduce the area of contact between the inner edge of the pocket and the substrate. The plate could comprise a susceptor for a low pressure single wafer chemical vapor deposition (CVD) tool. Moreover, the members are positioned to provide a minimum of two points of contact between the substrate and the inner edge of the apparatus. The invention is especially useful because the substrate is used in an environment that produces substrate warpage, such as thermal chemical vapor deposition (CVD), annealing, and a physical vapor deposition (PVD).

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Figure 1:
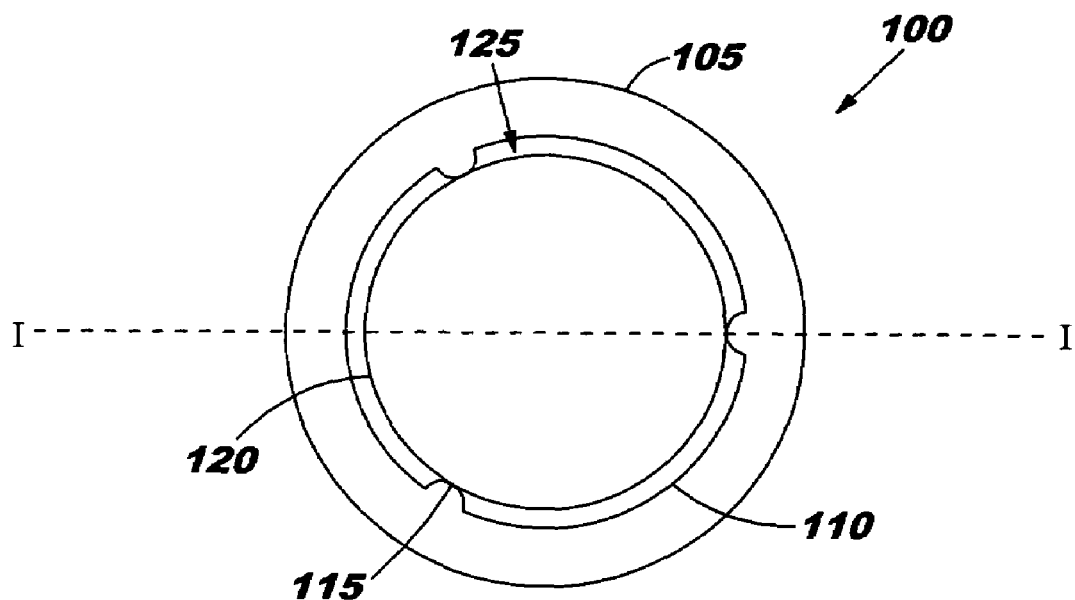
FIG. 1 is a top view schematic diagram of an apparatus for holding a substrate according to a first embodiment of the present invention.
Figure 2:
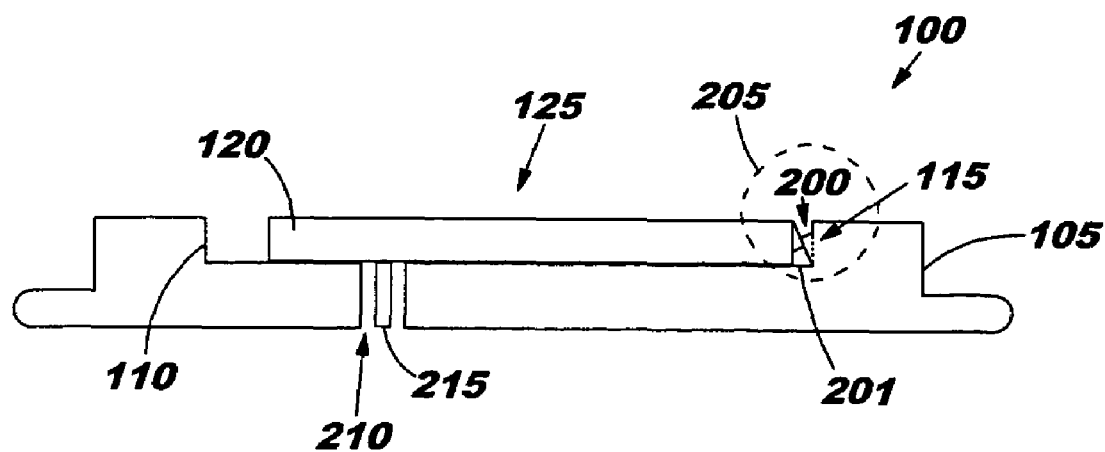
FIG. 2 is a cross-sectional schematic diagram of the apparatus shown in FIG. 1 along line I-I.
Figure 3:
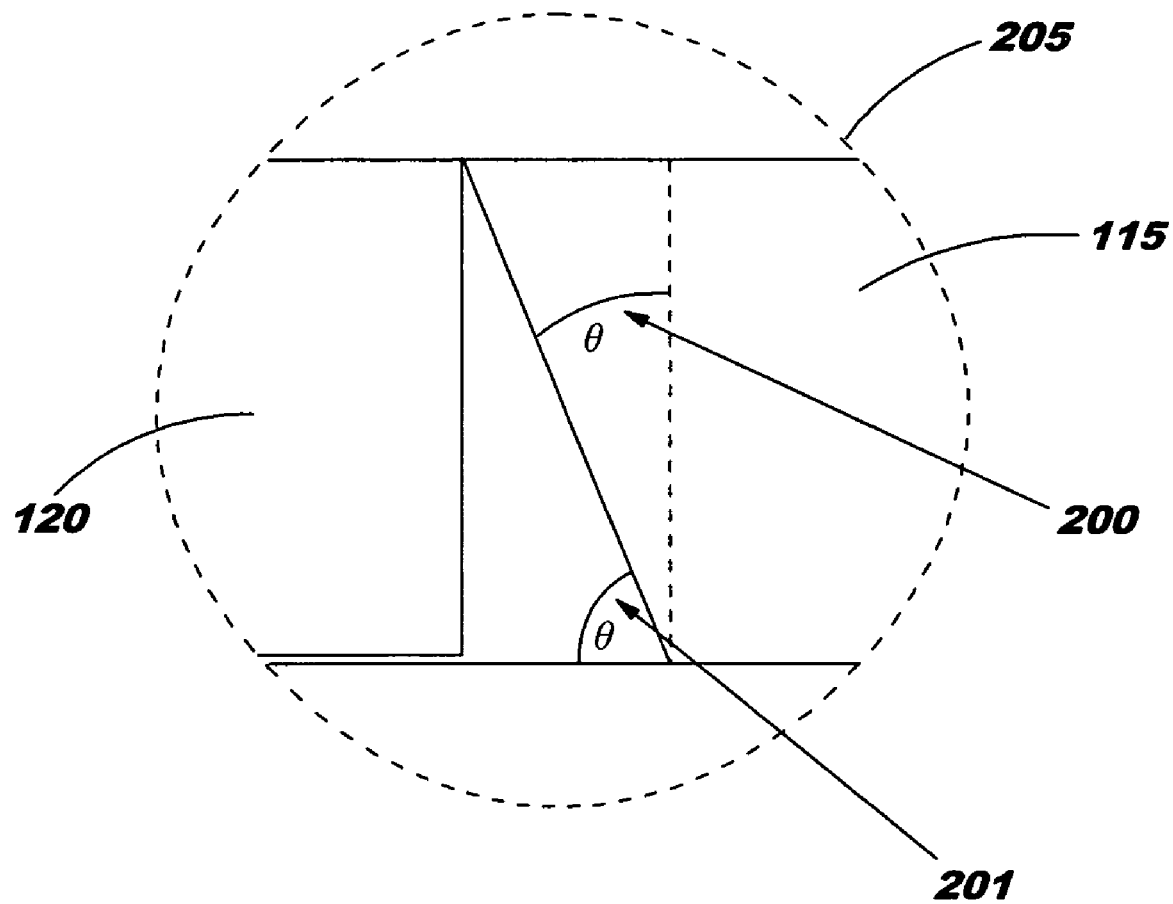
FIG. 3 is a magnified schematic diagram of the portion 205 of the apparatus shown in FIG. 2.

As mentioned, there is a need for a new and improved apparatus for holding a substrate during semiconductor processing thereby resulting in improved film uniformity on the semiconductor wafer undergoing processing. Current susceptors do not guarantee good film uniformity for single wafer tools. Referring now to the drawings, and more particularly to FIGS. 1-3, there are shown preferred embodiments of the structures according to the present invention.

More specifically, FIG. 1 is a top view of an apparatus 100 for holding a substrate 120. For example, the apparatus could be a susceptor that holds a wafer and provides a conduction path for heating the wafer. The apparatus includes an outer wall 105 and an inner wall 110 that defines a pocket (trench, cutout, opening, etc.) 125 in which the wafer 120 is positioned. The inner wall 110 includes projections 115 that extend radially inward and that make contact with the substrate 120. Otherwise, the inner wall 110 is not beveled and is substantially perpendicular to the bottom of the pocket 125. The projections 115 are shown in FIG. 1 as having a "C" or "U" finger-like shape when viewed from the top; however, the projections could have a number of different shapes depending upon the specific application. In addition, three projections 115 are shown in FIG. 1; however, the number of projections can be unlimited, so long as there are at least two projections to prevent the substrate 120 from contacting the inner wall 110.

In other words, the projections 115 prevent the substrate 120 from contacting the remaining portions of the inner wall 110 of the apparatus 100. Therefore, the projections 115 substantially reduce the area of contact between the side wall of the substrate 120 and the inner wall 110. Reducing this area of contact decreases the amount of heat transfer from the inner wall 110 and the side wall of the substrate 120. By decreasing the amount of heat transfer between inner wall 110 and the side wall of the substrate 120, the likelihood of the substrate 120 melting or sticking to the inner wall 110 is substantially reduced or eliminated thereby preventing wafer out of pocket errors. Additionally, the likelihood of a thermal stress developing across the substrate 120 due to the edge of the substrate 120 becoming hotter than the center of the substrate 120 is also substantially reduced or eliminated thereby improving film uniformity. Similarly, the likelihood of a thermal stress developing across the substrate 120 and causing warpage of the substrate 120 is also substantially reduced or eliminated thereby improving film uniformity and preventing wafer out of pocket errors.

FIG. 2 illustrates a cross-section of the apparatus 100 shown in FIG. 1 along line I-I. In addition to the outer wall 105, inner wall 110, projections 115, and substrate 120; FIG. 2 also illustrates a device 215 (pin) within an opening 210 that is used to lift the substrate 120 from the pocket 125 when necessary. FIG. 2 also illustrates the gap between the inner wall 110 and the side wall of the substrate 120 that is created by the projections 115.

FIG. 2 also illustrates angles 200, 201 that formed by the beveled side wall of the projection 115. The region 205 is shown in magnified form in FIG. 3. The angle 200 is generally between 5 and 10 degrees, although the invention is not limited to this specific range of angles, but is applicable to all ranges of appropriate angles, depending upon the specific application being addressed. Therefore, the angle 201 comprises an acute angle. Thus, the angle between the bottom of the pocket 125 and the linear inclined surface of the projection 115 is less than 90 degrees (e.g., 80-85 degrees). The beveled side wall of the projection 115 further reduces the contact area between the projection 115 and the substrate 120, thereby further reducing the possibility that the substrate 120 will stick within the pocket 125 of the apparatus 100.

The apparatus 100 is made of a substantially rigid material such as graphite and the projection 115 is made of a thermally conductive material such as silicon carbide; however, the projection 115 will experience some deformity when contacting the substrate 120. This small amount of deformity helps maintain the substrate 120 securely within the pocket 125. In other words, the upper portion of the beveled edge of the projection 115 presses firmly against the substrate 120 to hold the substrate 120 in position. Therefore, the substrate 120 will not move within the pocket. This increases processing precision and yield because the substrate 120 remains in position during processing which results in improved film uniformity and reduced foreign material.

There are several benefits of the present invention. First, the present invention provides an apparatus for holding a substrate during semiconductor processing thereby resulting in improved film uniformity on the substrate undergoing processing for improving yield. The present invention provides for installation of a new apparatus into a process system with a guarantee of repeatable good uniformities and without requiring rework of the susceptor thereby improving the process system availability and reducing costs. Another benefit of the present invention is that it provides good process results even with shifts in the level of the susceptor since the substrate is kept securely within the pocket. Additionally, the present invention provides small points of contact with the wafer to minimize the amount of heat transfer from the apparatus to the substrate thereby minimizing thermal stress on the substrate. Also, the present invention improves the angle of the contacts to prevent wafer out of pocket errors which increases process system availability.

While the invention has been described in terms of preferred embodiments, those skilled in the art will recognize that the invention can be practiced with modification within the spirit and scope of the appended claims.

What is claimed is:

1. An apparatus for holding a substrate, said apparatus comprising:

a pocket adapted to hold said substrate, wherein said pocket comprises an inner edge and a lower surface;

a plurality of projections extending radially inward from said inner edge;

an opening in said lower surface; and a pin disposed in said opening, said pin being configured for lifting said substrate from said pocket;

wherein said projections have a beveled edge, such that an acute angle greater than 80 degrees occurs between said lower surface and said beveled edge, and wherein said projections reduce an area of contact between said inner edge and said substrate.

2. The apparatus of claim 1, wherein said apparatus comprises a susceptor for holding said substrate.

3. The apparatus of claim 1, wherein said projections have a "C" shape.

4. The apparatus of claim 1, wherein said projections maintain a gap between a sidewall of said substrate and said inner edge.

5. The apparatus of claim 1, wherein said acute angle comprises an angle not greater than 85 degrees.

6. The apparatus of claim 1, wherein said projections prevent said substrate from moving within said pocket.

7. An apparatus for holding a substrate, said apparatus comprising:
   a pocket adapted to hold said substrate, wherein said pocket comprises an inner edge and a lower surface;
   a plurality of projections extending radially inward from said inner edge; and
   an opening in said lower surface;
   wherein said projections have a beveled edge, and
   wherein an acute angle greater than 80 degrees occurs between said lower surface and said beveled edge.

8. The apparatus in claim 7, wherein said projections reduce an area of contact between said inner edge and said substrate.

9. The apparatus of claim 7, wherein said apparatus comprises a susceptor for holding said substrate.

10. The apparatus of claim 7, wherein said projections have a "C" shape.

11. The apparatus of claim 7, wherein said projections maintain a gap between a sidewall of said substrate and said inner edge.

12. The apparatus of claim 7, wherein said acute angle comprises an angle not greater than 85 degrees.

13. The apparatus of claim 7, wherein said projections prevent said substrate from moving within said packet.

14. A susceptor for holding a wafer, said susceptor comprising:
   a pocket adapted to bold said wafer, wherein said pocket comprises an inner edge and a lower surface;
   a plurality of projections extending radially inward from said inner edge; and
   a device positioned below said pocket said device being configured for lifting said wafer from said pocket;
   wherein said projections have a beveled edge, and
   wherein art acute angle greater than 80 degrees occurs between said lower surface and said beveled edge.

15. The susceptor of claim 14, wherein said acute angle is not greater than 85 degrees.

16. The susceptor of claim 15, wherein said projections have a "C" shape.

* * * * *